(12) United States Patent
Niedermeier

(10) Patent No.: US 10,560,998 B2
(45) Date of Patent: Feb. 11, 2020

(54) CIRCUIT ASSEMBLY AND METHOD FOR SIMULATING A LOAD CURRENT FROM AN ON-BOARD ELECTRICAL SYSTEM

(71) Applicant: OSRAM GmbH, Munich (DE)

(72) Inventor: Peter Niedermeier, Munich (DE)

(73) Assignee: OSRAM BETEILIGUNGSVERWALTUNG GMBH, Grunwald (DE)

( * ) Notice: Subject to any disclaimer, the term of this patent is extended or adjusted under 35 U.S.C. 154(b) by 0 days.

(21) Appl. No.: 16/098,473

(22) PCT Filed: May 4, 2017

(86) PCT No.: PCT/EP2017/060699
§ 371 (c)(1),
(2) Date: Nov. 2, 2018

(87) PCT Pub. No.: WO2017/191280
PCT Pub. Date: Nov. 9, 2017

(65) Prior Publication Data
US 2019/0150237 A1    May 16, 2019

(30) Foreign Application Priority Data

May 6, 2016 (DE) .................. 10 2016 207 825

(51) Int. Cl.
*H05B 33/08* (2006.01)
*B60Q 11/00* (2006.01)
*G01R 31/44* (2020.01)

(52) U.S. Cl.
CPC ......... *H05B 33/089* (2013.01); *B60Q 11/005* (2013.01); *H05B 33/0815* (2013.01); *H05B 33/0824* (2013.01); *G01R 31/44* (2013.01)

(58) Field of Classification Search
CPC .............. H05B 33/08; H05B 33/0815; H05B 33/0824; H05B 33/0842; H05B 33/0845;
(Continued)

(56) References Cited

U.S. PATENT DOCUMENTS

| 6,948,469 B2 * | 9/2005 | Harada .................. B60Q 3/80 123/179.4 |
| 2002/0033702 A1 | 3/2002 | St-German |

(Continued)

FOREIGN PATENT DOCUMENTS

| DE | 10215486 C1 | 10/2003 |
| DE | 102004045435 A1 | 3/2006 |

(Continued)

OTHER PUBLICATIONS

German Search Report based on application No. 10 2016 207 825.9 (8 pages) dated Feb. 3, 2017 (for reference purpose only).

(Continued)

*Primary Examiner* — Jimmy T Vu
(74) *Attorney, Agent, or Firm* — Viering, Jentschura & Partner MBB

(57) ABSTRACT

A circuit assembly for simulating a load current from an on-board network having an input connected to a line of the on-board network of a vehicle for connecting to a load, an output connected to a light source which replaces the load. A series circuit formed by a resistor and a switch, wherein the resistor has a resistance in the same order as that of the load to be simulated, and the series circuit is connected in parallel with the input. A switching controller with the input connected in parallel to the input of the circuit assembly, and draws a current from the line of the on-board network for connecting to a load smaller than the load current of the load to be replaced. The circuit assembly is open the switch and (Continued)

actuate the switching controller and to close the switch and deactivate the switching controller.

6 Claims, 4 Drawing Sheets

(58) Field of Classification Search
CPC .. H05B 33/0854; H05B 33/089; H05B 37/02; B60Q 11/005; G01R 31/44
See application file for complete search history.

(56) References Cited

U.S. PATENT DOCUMENTS

2011/0062869 A1* 3/2011 Hsu .................... B60Q 11/005
  315/77
2014/0029285 A1  1/2014 Bittinger et al.

FOREIGN PATENT DOCUMENTS

| DE | 10 2008 048 197 A1 | 3/2010 |
| DE | 20 2010 015 919 U1 | 3/2011 |
| DE | 10 2009 052 690 B3 | 4/2011 |
| DE | 10 2011 007 123 A1 | 10/2012 |
| DE | 10 2013 003 765 A1 | 2/2014 |

OTHER PUBLICATIONS

International Search Report based on application No. PCT/EP2017/060699 (5 pages + 2 pages English translation) dated Jun. 22, 2017 (for reference purpose only).

* cited by examiner

CIRCUIT ASSEMBLY AND METHOD FOR SIMULATING A LOAD CURRENT FROM AN ON-BOARD ELECTRICAL SYSTEM

CROSS-REFERENCE TO RELATED APPLICATION

The present application is a national stage entry according to 35 U.S.C. § 371 of PCT application No.: PCT/EP2017/060699 filed on May 4, 2017, which claims priority from German Patent Application Serial No.: 10 2016 207 825.9 which was filed May 6, 2016, and is incorporated herein by reference in its entirety and for all purposes.

TECHNICAL FIELD

The description relates to a circuit assembly and a method for simulating a load current from an on-board network, including an input designed to be connected to a line of the on-board network for connecting to a load, an output for connecting to a light source which replaces the load, wherein the light source has a lower current consumption than the load which is to be replaced.

BACKGROUND

The description proceeds from a circuit assembly and a method for simulating a load current from an on-board network, of the generic type.

In recent times, LED-based retrofit lamps have conquered extensive areas of the lighting technology sector, particularly in the field of general lighting. However, retrofit lamps are also increasingly to be found in the automobile industry, where they are intended to, and are capable of replacing the filament lamps employed in this sector. These retrofit lamps have two major advantages: firstly, they are significantly superior to related filament lamp-based items, in terms of energy saving.

Secondly, they have a significantly longer service life than the original lamps. Specifically, however, the first advantage results in practical problems in an automobile context, as state-of-the-art vehicles incorporate a monitoring function for filament lamps. This customarily monitors two factors: firstly, with the light in the switched-off state, the resistance of the filament is measured, and it is thus established whether the filament lamp is still functional. Moreover, with the corresponding lamp in service, the current in the lamp is measured. If the resistance exceeds a reference value, or if the current is lower than a reference value, the corresponding line is switched-out, and the on-board computer notifies the driver that the lamp concerned is defective and requires replacement.

Accordingly, the simple replacement of a filament lamp with a retrofit lamp in vehicles of this type is not possible.

SUMMARY

The description relates to a circuit assembly for simulating a load current from an on-board network, which permits the use of retrofit lamps in an automobile, in place of filament lamps. Further describing a suitable method by means of which a filament lamp may be replaced with an LED retrofit lamp in a simple manner.

According to the description, a circuit assembly for simulating a load current from an on-board network, including an input configured to be connected to a line of the on-board network for connecting to a load, an output for connecting to a light source which replaces the load, wherein the light source has a lower current consumption than the load which is to be replaced, a series circuit comprised of a resistor and a switch, wherein the resistor is rated to a comparable order of magnitude to the resistance of the load to be simulated, and the series circuit is connected in parallel with the input, a switching controller, the input of which is connected in parallel with the input of the circuit assembly, and which draws a current from the line of the on-board network for connecting to a load which is smaller than the load current of the load to be replaced, wherein the circuit assembly is designed, upon the activation of the load, to open the switch and actuate the switching controller and, upon the disconnection of the load, to close the switch and deactivate the switching controller, wherein an output of the switching controller feeds the load current drawn back into the on-board network. With these measures, the construction of a light function of an automobile by relatively simple means is advantageously possible, without a malfunction or a defective lamp being registered by the on-board computer located in the automobile because the operating current is too low due to the low-energy retrofit lamp.

In one form of a non-limiting embodiment, the load is a filament lamp. In the case of the majority of headlamps of older and lower-price vehicles, all or almost all light functions are realized with filament lamps. Only in the case of such headlamps is replacement with retrofit lamps sensible, since only filament lamps require so much electrical current that replacement is worthwhile.

In a non-limiting embodiment, the light source is an LED module or an LED retrofit lamp. LEDs as lighting means are already established as the standard in the lighting sector, are small and powerful and thus ideally suited for such an object.

In a non-limiting embodiment, the switching controller is a step-up converter. A step-up converter is comparatively easy and economical to produce, and is capable of easily feeding the energy drawn from the light functions back into the on-board network.

In the event of a defect in the light source, the switching controller continues to remain disconnected, and the switch continues to remain open. This measure provides the great advantage that the failure of a filament lamp is thus simulated, since the open switch simulates a break in the filament, and the disconnected switching controller draws no load current. Therefore, the on-board computer of the vehicle registers a defective filament lamp and thus correctly notifies the vehicle driver of a defective light source.

Further advantageous further developments and configurations of the circuit assembly according to the invention for simulating a load current from an on-board network proceed from the further dependent claims, and from the following description.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DETAILED DESCRIPTION

Figure 1:
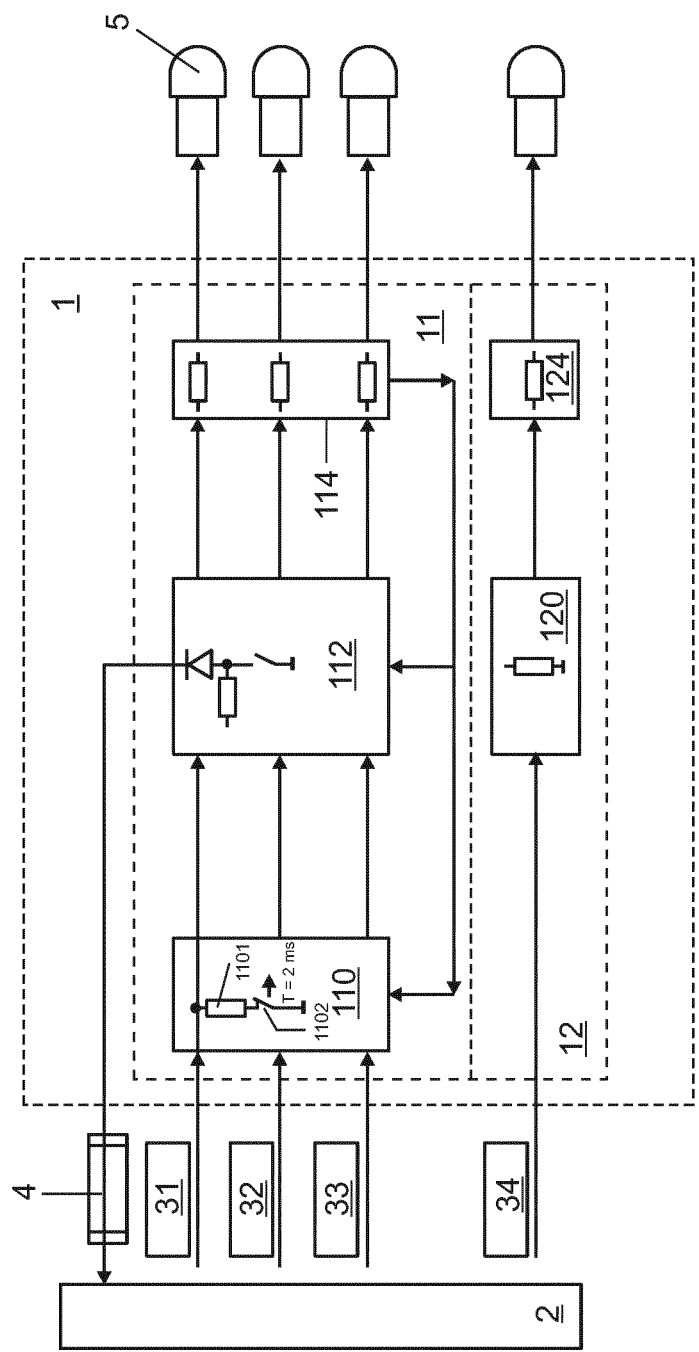
FIG. 1 shows a schematic representation of a complete module for a vehicle in a first form of a non-limiting embodiment, which delivers a load current simulation for the key functions involving operation with retrofit lamps.

FIG. 1 shows a schematic representation of a complete module 1 for a vehicle, which delivers a load simulation for key functions. The complete module 1 is comprised of various individual modules. However, the complete module may also be configured as an individual module, which incorporates all functions. In the present case, the complete module 1 is comprised of a load module 11 and a resistance module 12.

The function of load modules is the simulation of the load current for large loads, such as headlamps or indicator lamps.

The function of resistance modules is the simulation of the load current for small loads, such as e.g. license plate lights.

These two types of modules operate differently.

The load modules 11 include a cold lamp monitor 110, an electronic load 112 and an LED retrofit lamp monitor 114. The function of the cold lamp monitor 110 is to simulate a cold lamp in the switched-off state. The electronic load 112 generates a load current on the feeder line of the load to be replaced. By means of an electronic converter, this load current is fed back into the on-board network 2 at another point, such that the monitoring module of the vehicle only measures the load current on the line. During this check, the LED retrofit lamp is not switched on. This is either executed by means of a soft start function, wherein the LED retrofit lamp is only switched on after a few ms, or the cold lamp monitor 110 detects the execution of a cold lamp test on the monitoring module, and leaves the LED retrofit lamp switched off, e.g. for a specific time interval, thereby preventing any flash illumination of the latter during the cold lamp test. Finally, the LED retrofit lamp monitor 114 monitors the current in the LED retrofit lamp in the switched-on state, thereby confirming the operation thereof.

The resistance modules 12 are of substantially simpler design, and are consequently ideal for smaller loads, such as license plate lighting or interior lighting. The resistance module 12 includes a resistance load 120 and likewise an LED retrofit lamp monitor 124.

Figure 2:
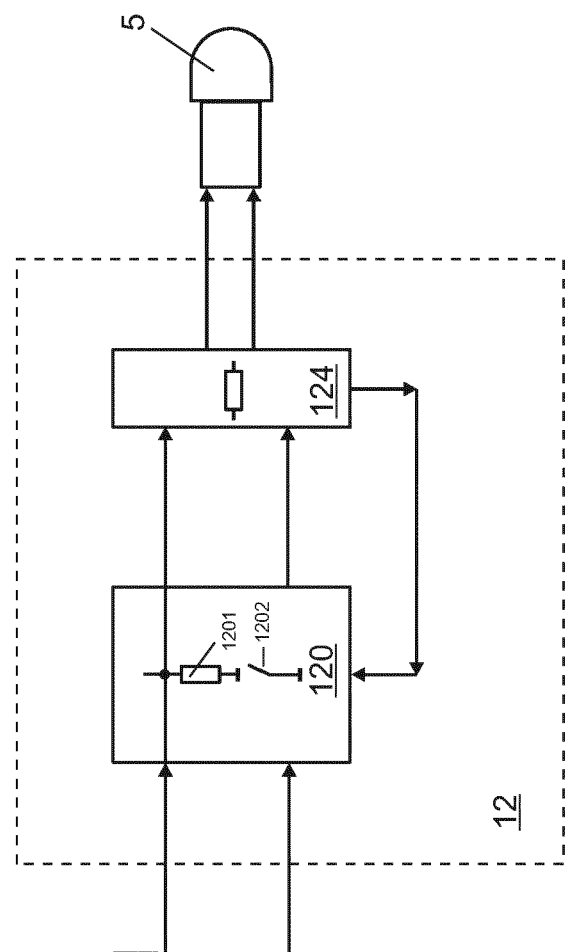
FIG. 2 shows a schematic representation of a resistance module for a vehicle, which delivers a load current simulation for one or more functions involving operation with retrofit lamps.

FIG. 2 shows a schematic representation of a resistance module for a vehicle, which delivers a load current simulation for a function 34. The resistance module 12 is of comparatively simple design, and is suitable for small loads such as interior lighting or license plate lighting. The resistance module 12 includes a combined cold lamp monitoring and load module 120, and an LED retrofit lamp monitor 124. In the resistance module, current which is to be drawn from the line is simply consumed in a load resistor 1201. The load resistor 1201 forms part of the combined cold lamp monitoring and load module 120, and must be rated such that it generates a current smaller than the rated current of the filament lamp to be replaced by at least the rated current of the retrofit lamp employed. Accordingly, the overall current will be of equal magnitude to the rated current of the filament lamp to be replaced.

The load resistor 1201 is connected in parallel with the input of the resistance module 12. In series with the load resistor 1201, a switch 1202 is further arranged, which is normally closed. Accordingly, the series circuit comprised of the load resistor 1201 and the switch 1202 is interconnected in the same way as the filament of the filament lamp to be replaced. This has two advantages: firstly, with the switch 1202 closed, the load resistor 1201 simulates the filament resistance of the filament of the filament lamp. As the load resistor 1201 generates a current which approximately corresponds to the rated current of the filament lamp, its resistance also lies within the range of the filament resistance of the filament lamp to be replaced. As a result, the load resistor simulates the filament resistance of the filament lamp, and the monitoring function in the vehicle detects the presence of a normally functioning filament lamp.

The resistance module 12 further includes an LED retrofit lamp monitor 124, which monitors the operation of the LED retrofit lamp 5, e.g. with reference to the current consumption of the lamp. If the lamp fails and is no longer functional, the LED retrofit lamp monitor 124 opens the switch 1202. The current circuit of the load resistor 1202 is thus interrupted such that, firstly, a filament failure in the filament lamp is simulated, as the resistance may no longer be measured and, secondly, no load current flows in an active current circuit, which likewise corresponds to the behavior of a filament lamp with a failed filament.

In consequence, the monitoring function of the vehicle detects a defective filament lamp, if the LED retrofit lamp 5 is defective. This corresponds to the desired behavior of the assembly.

Figure 3:
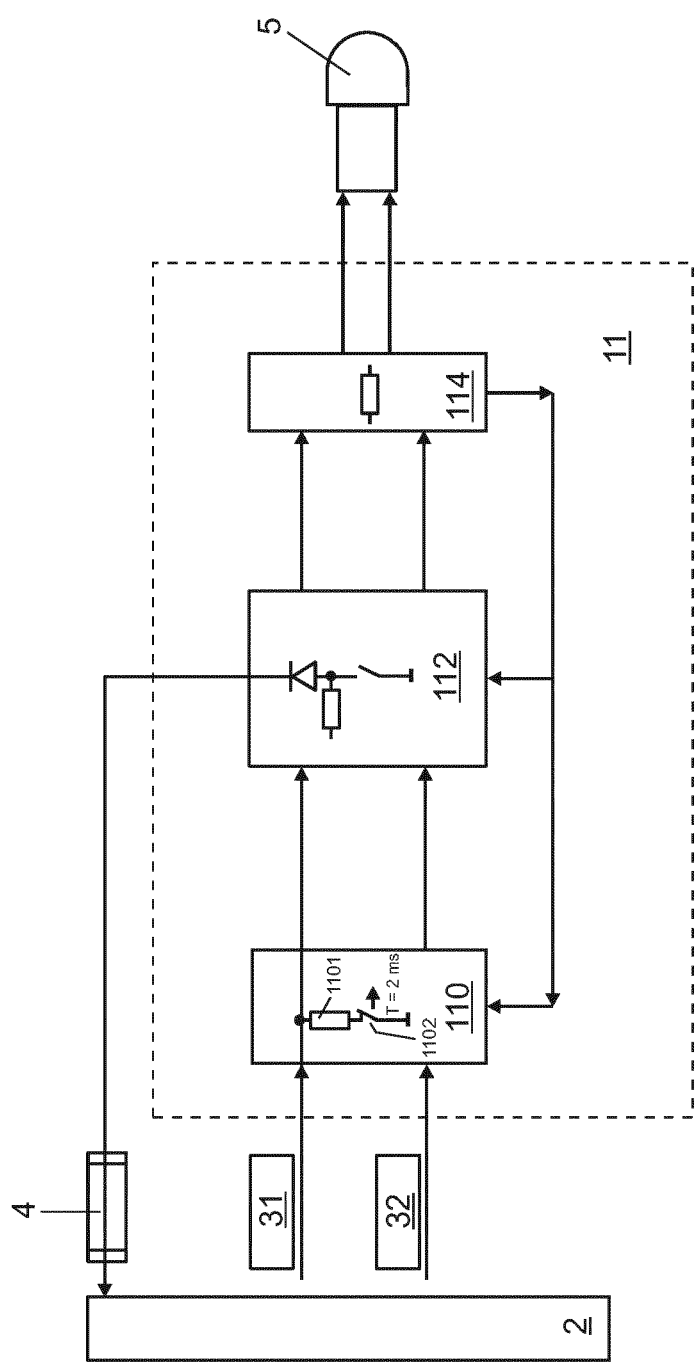
FIG. 3 shows a schematic representation of a load module for a vehicle, which delivers a load current simulation for a function involving operation with retrofit lamps.

FIG. 3 shows a schematic representation of a load module 11 for a vehicle, which delivers a load current simulation for a function 31 and for a function 32. The load module 11 is capable of feeding the simulated load current $i_L$ back into the on-board network 2 via a fuse 4, and is therefore particularly appropriate for light functions involving a high current consumption, such as headlamps or similar. In a cold lamp monitoring circuit 110, the load module 11 includes a resistor 1101 for filament simulation, and a switch 1102 connected in series with the resistor. The series circuit of the resistor 1101 and the switch 1102 is connected in parallel with the input of the load module 11, and consequently at the same point where the filament lamp to be replaced would be connected. The switch is normally closed, such that the resistor may simulate the filament resistance of the filament of the filament lamp which is to be replaced. To this end, the resistor 11 has a similar resistance rating to the cold resistance of the filament of the filament lamp which is to be replaced. The load module 11 further includes an LED retrofit lamp monitor 114 which, e.g. on the basis of the current in the switched-on state, monitors the operation of the retrofit lamp. If the LED retrofit lamp 5 is defective, the LED retrofit lamp monitor 114 then opens the switch 1102, and thus simulates a failed filament in the filament lamp which is to be replaced.

The load module 11 further includes an electronic load 112. The electronic load 112 may be a DC voltage converter such as, e.g. a step-up converter or a flyback converter. The input of the electronic load 112 is connected in parallel with the input of the load module 11. The output of the electronic load 112 is connected to the on-board network 2. For the purposes of safety, a further fuse 4 is arranged between the on-board network 2 and the electronic load 112. The electronic load 112 thus generates a load current on the line to which the filament lamp which is to be replaced is normally connected. The load current may corresponds to the load current of the filament lamp which is to be replaced, minus the current of the retrofit lamp. The total current thus corresponds exactly to the current of the filament lamp which is to be replaced. The infeed to the on-board network of the vehicle must proceed at a location which is not monitored by the monitoring function of the vehicle. Accordingly, the monitoring function of the vehicle does not detect the current injected, and only measures the current drawn on the relevant line for the filament lamp. During the correct operation of the LED retrofit lamp 5, the monitoring function of the vehicle thus detects no error. By the feedback of power to the on-board system, this solution is highly energy-efficient, as losses are limited to conversion losses on the electronic load 112, which are very low. Upon the switch-on of the function, the electronic load 112 is switched on, and the switch 1102 of the cold lamp monitor 110 is simultaneously open, as an excessively high load current and unwanted current consumption in the load resistor 1101 would otherwise occur. In this case, the function of the load resistor is thus restricted to the simulation of the cold filament in the lamp which is to be replaced, rather than the consumption of the load current, which is executed by means of the electronic load 112.

If the LED retrofit lamp monitor 114 detects a defective LED retrofit lamp 5, it switches off the converter. Where the switch 1101 is simultaneously open, current consumption is reduced to virtually zero, and the monitoring function of the vehicle detects and indicates a defective filament lamp, as required.

Figure 4:
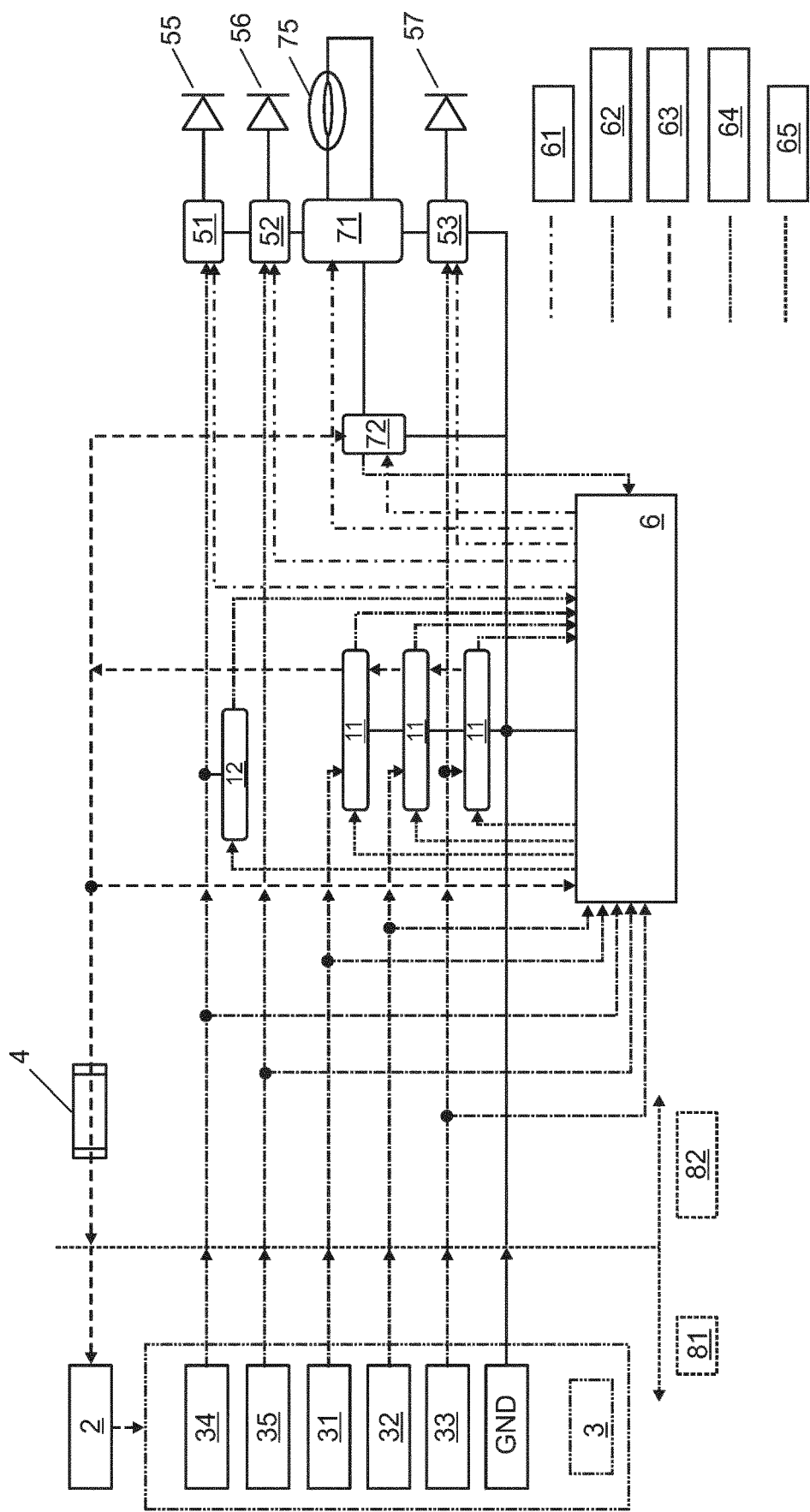
FIG. 4 shows a schematic representation of a complete module in a second form of a non-limiting embodiment, in the form of a front headlight having a high-pressure xenon discharge lamp as the headlamp, and LEDs for the remaining light functions.

FIG. 4 shows a schematic representation of a complete module in a second form of embodiment, in the form of a front headlight 82 having a high-pressure xenon discharge lamp 75 as the headlamp, and LEDs 55, 56, 57 for the remaining light functions. The front headlight 82 is a retrofit headlight for an original headlight in a vehicle 81, having energy-saving light functions. By the replacement of a complete headlight, rather than the replacement of individual lamps, the fitting of energy-saving long-life light functions is substantially easier for the user, and may be offered more cost-effectively by a workshop, in the light of the substantial time saving in replacement operations.

The headlight 82 delivers light functions for dipped beam lighting 32, main beam lighting 31, daytime running lighting 35, side lighting 34 and indicator lighting 33, which are monitored by an on-board computer 6 via the lines 62. In the original headlamps of budget vehicles, functions for dipped beam lighting, main beam lighting, side lighting and indicator lighting are customarily provided by filament lamps. Today, the daytime running light function, even in the original headlamps of low-cost vehicles, is already provided by means of LEDs.

For high-power light functions, namely dipped beam lighting, main beam lighting and indicator lighting, load modules 11 are provided which, as described above, incorporate a load current simulation function and a filament simulation function. The load modules 11 are actuated via the lines 65, by means of a central controller 6 which is incorporated in the headlamp. The load modules feedback information on the simulated load current to the controller 6 via the lines 64.

For the dipped beam and main beam light functions, the headlamp incorporates a high-pressure xenon discharge lamp 75. The high-pressure xenon discharge lamp 75 is operated by an electronic operating device 71. The switchover between the dipped beam and main beam light functions in the headlamp 82 is executed by a selector switch for the main beam light function 72. The selector switch for the main beam light function 72 is directly connected to the on-board network via the line 63, as the high-pressure xenon discharge lamp 75, during start-up, requires a very high current, which exceeds the current rating of the filament lamp which is to be replaced, and the on-board computer 3 would otherwise indicate an error, if the current were to be drawn from the line 62. For this reason, the load modules 11 for these two functions are also designed to simulate the full load current of the filament lamp which is to be replaced. These load modules are then naturally connected via the lines 62 to the corresponding light functions 31, 32 on the on-board computer 3. The load modules 11 feedback information on the current drawn to the controller 6 via the lines 64.

The selector switch for the main beam light function 72 likewise feeds back information on the current drawn by the high-pressure xenon discharge lamp 75 to the controller 6 via a line 64. The electronic operating device 71 is directly connected to the selector switch for the main beam light function 72, and draws its operating current via the latter. The controller 6 actuates the selector switch for the main beam light function 72 and the electronic operating device 71. The selector switch for the main beam light function 72 is configured for the switch-over between the dipped beam light function and main beam light function, and the electronic operating device 71 is configured for the general switch-on and switch-off of the light function. If the high-pressure xenon discharge lamp 75 is defective, the controller 6 permanently switches off the electronic operating device 71, and switches the associated load module 11 for the simulation of a defective filament lamp (see above), such that the on-board computer 3 notifies an error to the driver. The full functionality of dipped beam and main beam light functions is maintained accordingly.

For the indicator light function, one or more LEDS 57 are provided in the headlamp, which are operated by an electronic operating device 53. The electronic operating device 53 draws its current via the indicator lighting function 33 of the on-board computer 3 via a line 62. For the indicator light function 33, a load module 11 is provided, which likewise draws the differential current between the filament lamp which is to be replaced and the LED 57 via the line 62, such that the current measurement system of the on-board computer 3 measures the correct current for this function. The load module feeds current back into the on-board network via a line 63, at a point which is not monitored by the on-board computer. The electronic control device 53 and the load module 11 are actuated by the controller 6. The load module is actuated via a control line 65, and the electronic operating device 53 is actuated via a control line 61. If the LED 57 fails, the electronic operating device 53 is permanently switched off and the load module is actuated such that it simulates a defective filament lamp. The on-board computer 3 thus correctly indicates a defective lamp to the driver.

For the daytime running light function 35, only an electronic operating device 52 is provided, and no load module, as this function is likewise executed in the original headlamp by LEDs, and the current consumption is thus identical. The electronic control device 52 is still actuated by the controller 6 via a control line 61. The controller 6 measures the current for the daytime running light function 35 via a measuring line 64. If an LED 56 for this light function is defective, the controller permanently switches off the electronic operating device 52, and the on-board computer 3 indicates the malfunction to the driver.

For the side light function, an LED 55 is provided in the headlight 82. The LED 55 is operated by an electronic operating device 51. The electronic operating device 51 draws its current via a line 62 from the side light function 34. A resistance module 12 is provided, which draws the differential current between the original filament lamp and the LED 55 from the line 62. Accordingly, for the on-board computer 3, the current consumption corresponds to that of an original filament lamp, and no error message is generated. The electronic operating device 51 is actuated by the controller 6 via a line 61. The resistance module is actuated by the controller 6 via a line 65. In the event of the failure of the LED 55, the controller 6 permanently switches off the electronic operating device 51, and actuates the resistance module 12 such that the latter simulates a defective filament lamp. The on-board computer thus correctly indicates a defective side light to the driver.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

LIST OF REFERENCE NUMBERS

1 Complete module
2 On-board network
3 Monitoring function in vehicle, on-board computer
4 Fuse
5 LED retrofit lamps
6 Controller
11 Load module
12 Resistance module
31 Main beam light function
32 Dipped beam light function
33 Indicator light function
34 Side light function
35 Daytime running light function
51 Driver for side light
52 Driver for daytime running light
53 Driver for indicator light
55 Side light LEDs
56 Daytime running light LEDs
57 Indicator light LEDS
61 Control line of electronic operating device
62 Current monitored by vehicle monitoring function
63 Direct connection to on-board network 2
64 Current measurement
65 Control line of load module 11
71 Electronic operating device of high-pressure xenon discharge lamp
72 Main beam light function of high-pressure xenon discharge lamp
75 High-pressure xenon discharge lamp
81 Automobile
82 Front headlight
110 Cold lamp monitor
112 Switching controller
114 LED retrofit lamp monitor
1101 Resistor
1102 Switch
1201 Load resistor
1202 Switch

What is claimed is:

1. A circuit assembly for simulating a first load current for a first load to be simulated in an on-board network, comprising:
    an input configured to be connected to a line of the on-board network of a vehicle for connecting to a second load,
    an output for connecting to a light source, wherein the light source has a lower current consumption than the first load to be simulated,
    a series circuit comprising a resistor and a switch, wherein the resistor is rated to a comparable order of magnitude to a resistance of the first load to be simulated, and the series circuit is connected in parallel with the input,
    a switching controller, wherein an input of the switching controller is connected in parallel with the input of the circuit assembly, and draws a current from the line of the on-board network for connecting to the second load, wherein a second load current is smaller than the first load current,
    wherein the circuit assembly is configured, upon the activation of the second load, to open the switch and activate the switching controller and, upon the disconnection of the second load, to close the switch and deactivate the switching controller, wherein an output of the switching controller feeds at least a portion of the drawn load current back into the on-board network,
    wherein upon the activation of the second load, the light source is only switched on after a specific time interval following the closing of the switch.

2. The circuit assembly as claimed in claim 1, wherein the first load is a filament lamp.

3. The circuit assembly as claimed in claim 1, wherein the light source is an LED module with an associated electronic operating device.

4. The circuit assembly as claimed in claim 1, wherein the switching controller is a step-up controller.

5. The circuit assembly as claimed in claim 1, wherein in the event of a defect in the light source, the switching controller continues to remain disconnected, and the switch continues to remain open.

6. The circuit assembly as claimed in claim 1, wherein the light source is an LED retrofit lamp with an associated electronic operating device.

* * * * *